United States Patent
Lai et al.

(10) Patent No.: US 6,566,225 B2
(45) Date of Patent: May 20, 2003

(54) FORMATION METHOD OF SHALLOW TRENCH ISOLATION

(75) Inventors: Erh-Kun Lai, Taichung (TW); Hsin-Huei Chen, Miao-Li (TW); Yu-Ping Huang, Taichung (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/921,580

(22) Filed: Aug. 6, 2001

(65) Prior Publication Data

US 2003/0027404 A1 Feb. 6, 2003

(51) Int. Cl.[7] .................... H01L 21/336; H01L 21/76; H01L 29/00
(52) U.S. Cl. ............... 438/424; 438/427; 438/435; 438/296; 257/510
(58) Field of Search ................ 438/424, 427, 438/435, 296; 257/510

(56) References Cited

U.S. PATENT DOCUMENTS

| | | | | |
|---|---|---|---|---|
| 5,837,612 A | * | 11/1998 | Ajuria et al. | 438/697 |
| 5,930,645 A | * | 7/1999 | Lyons et al. | 438/424 |
| 6,080,637 A | * | 6/2000 | Huang et al. | 438/424 |
| 6,093,621 A | * | 7/2000 | Tseng | 438/424 |
| 6,096,622 A | * | 8/2000 | Kim et al. | 438/424 |
| 6,143,623 A | * | 11/2000 | Tsuda et al. | 438/425 |
| 6,238,997 B1 | * | 5/2001 | Chen et al. | 438/400 |
| 6,251,747 B1 | * | 6/2001 | Zheng et al. | 438/424 |
| 6,274,455 B1 | * | 8/2001 | Seo | 438/400 |
| 6,284,623 B1 | * | 9/2001 | Zhang et al. | 438/424 |
| 6,355,539 B1 | * | 3/2002 | Lai et al. | 438/424 |

FOREIGN PATENT DOCUMENTS

| | | | |
|---|---|---|---|
| JP | 405095043 A | * | 4/1993 |
| JP | 405226466 A | * | 9/1993 |
| JP | 406037178 A | * | 2/1994 |
| JP | 406314739 A | * | 11/1994 |
| JP | 406334031 A | * | 12/1994 |

* cited by examiner

Primary Examiner—Matthew Smith
Assistant Examiner—Chuong A Luu

(57) ABSTRACT

The present invention provides a formation method of a trench structure comprising forming a pad oxide layer on a substrate. A first polysilicon layer is formed on the pad oxide layer and an oxide layer is formed thereon. A second polysilicon layer is formed on the oxide layer. The partial second polysilicon layer, the oxide layer, the first polysilicon layer, and the pad oxide layer are removed to expose the partial substrate. The second polysilicon layer and the partial substrate are etched for forming the trench structure in the substrate. An etched depth of the trench structure is well controlled by the etched thickness of the second polysilicon layer.

7 Claims, 3 Drawing Sheets

FORMATION METHOD OF SHALLOW TRENCH ISOLATION

BACKGROUND OF THE INVENTION

1. Field of the Invention

The invention relates to a method of forming shallow trench isolations, and more particularly to a method of forming shallow trench with reduction of micro-loading during formation and reduction of corner recess.

2. Description of the Prior Art

A drawback of conventional LOCOS is that it is susceptible to defects caused by the high stresses generated in the narrow active areas, underneath the nitride layer, during field oxidation. There are also defects caused by the KOOi effect. These defects can degrade the gate oxide quality and transistor performance. Defect generation is enhanced as the geometries shrink and the bird's beak encroachment becomes a more significant portion of the field oxide surface area. What is desired, therefore, is a means of forming an isolation region in a semiconductor substrate that does not have the drawbacks and shortcomings of conventional methods and/or known variations thereof, and that is useful for isolating integrated circuits devices (e.g. transistors) having a geometry (e.g. gate width) of 0.35 u.m. or less.

It is another method to isolate devices in an integrated circuit by using shallow-trench isolation. Generally, an anisotropic etching process is performed with using silicon nitride as a mask to form steep trenches on a semiconductor substrate. Then, by filling the trenches with oxide, shallow-trench isolations, which have top surfaces are in level with the top surface of the substrate, are formed on the substrate.

Unfortunately, for high integrated circuit, there is micro-loading effect during etching shallow trench structure. Such time-mode etching result in different control on the depths of the shallow trench structures. After formation of the shallow trench isolation, the problem of corner recess also degrades the performance of the shallow trench isolation.

However, there is a consideration to improve the characteristics of the shallow trench isolations during the formation thereof, and further reduce reliability degradation of the semiconductor device.

SUMMARY OF THE INVENTION

It is one object of the present invention to provide a formation method of shallow trench isolation. The depth of trench is easily controlled by the thickness of polysilicon instead of conventional time mode.

It is another object of the present invention to provide a formation method of shallow trench isolation. The polysilicon layer can prevent formation of trench from micro-loading and Kooi effect.

It is another object of the present invention to provide a formation method of shallow trench isolation. The oxidation of polysilicon during formation of liner layer of trench can prevent the trench from corner recess.

In the present invention, a formation method of a trench structure comprises forming a pad oxide layer on a substrate. A first polysilicon layer is formed on the pad oxide layer and an oxide layer is formed thereon. A second polysilicon layer is formed on the oxide layer. The partial second polysilicon layer, the oxide layer, the first polysilicon layer, and the pad oxide layer are removed to expose the partial substrate. The second polysilicon layer and the partial substrate are etched for forming the trench structure in the substrate. An etched depth of the trench structure is well controlled by the thickness of the second polysilicon layer. A liner layer is formed at the side-wall of the trench structure and simultaneously a side-wall oxide layer is at the side-wall of the first polysilicon layer. The side-wall oxide layer protects the trench structure against corner recess.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a formation method of a trench structure comprises forming a pad oxide layer on a substrate. A first polysilicon layer is formed on the pad oxide layer and an oxide layer is formed thereon. A second polysilicon layer is formed on the oxide layer. The partial second polysilicon layer, the oxide layer, the first polysilicon layer, and the pad oxide layer are removed to expose the partial substrate. The second polysilicon layer and the partial substrate are etched for forming the trench structure in the substrate. An etched depth of the trench structure is well controlled by the thickness of the second polysilicon layer. A liner layer is formed at the side-wall of the trench structure and simultaneously a side-wall oxide layer is at the side-wall of the first polysilicon layer. The side-wall oxide layer protects the trench structure against corner recess.

Figure 1A:
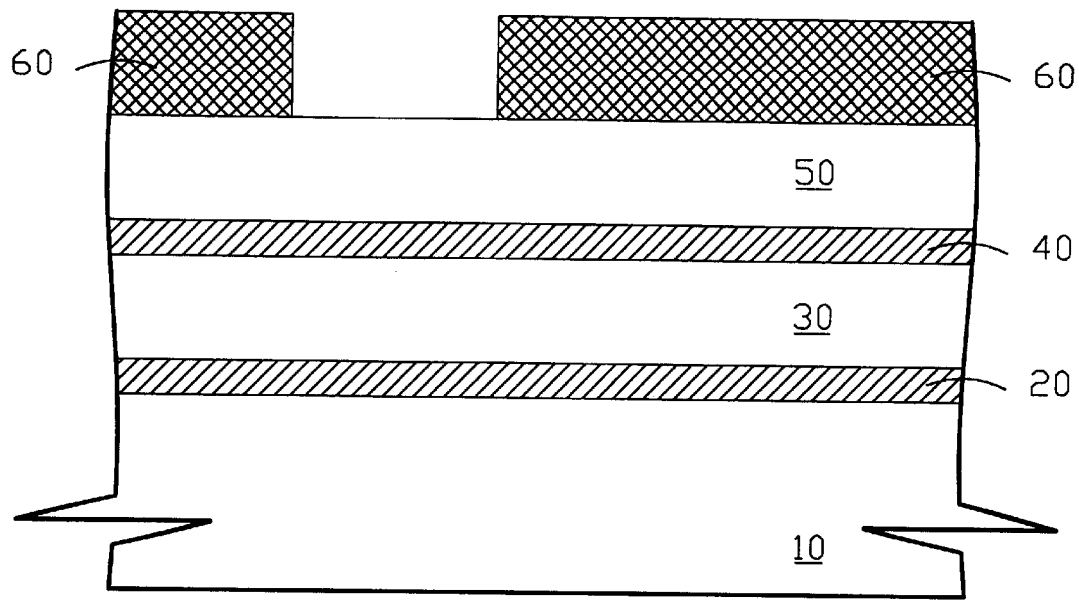
FIGS. 1A–1F are a series of cross-sectional schematic diagrams illustrating the formation of the shallow trench isolation in accordance with the present invention.

Depicted in FIG. 1A, a pad oxide layer 20 is formed on a silicon substrate 10 and a polysilicon layer 30, an oxide layer 40 and another polysilicon layer 50 are subsequently formed thereon. A patterned photo resist layer 60 for defining trench isolation is formed on the polysilicon layer 50.

Figure 1B:
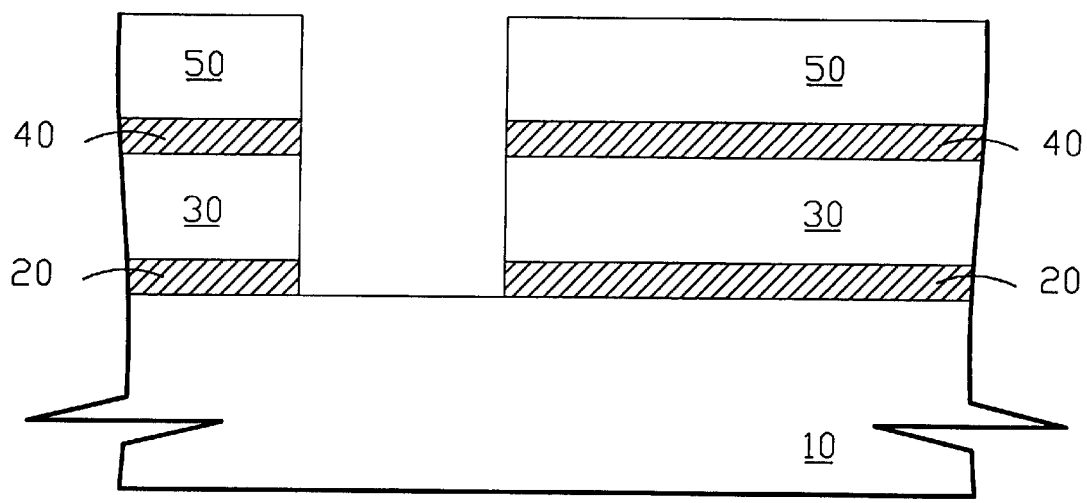

The polysilicon layer 50, the oxide layer 40, the polysilicon layer 30, and the pad oxide layer 20 are etched to expose the partial surface of the silicon substrate 10. Then the photo resist layer 60 is removed, shown in FIG. 1B.

Figure 1C:
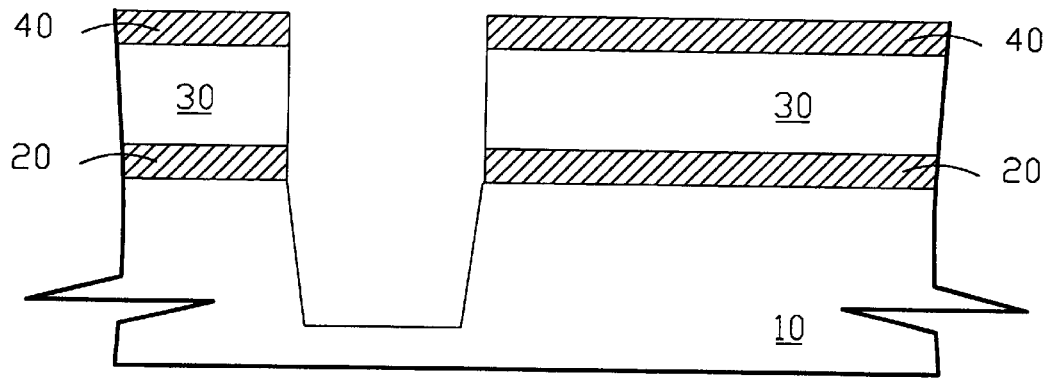

As a key step of the present invention, the exposed surface of the silicon substrate 10 is etched for forming trench in the silicon substrate 10. The etching of the silicon substrate 10 for forming the trench is controlled by simultaneously etching the polysilicon layer 50 and stopping at the oxide layer 40. Furthermore, the simultaneously etching of the polysilicon layer 50 and the silicon substrate 10 can prevent from micro-loading during the formation of the trench. Thus, the depth of the trench is easily controlled by the etched thickness of the polysilicon layer 50, shown in FIG. 1C.

Figure 1D:
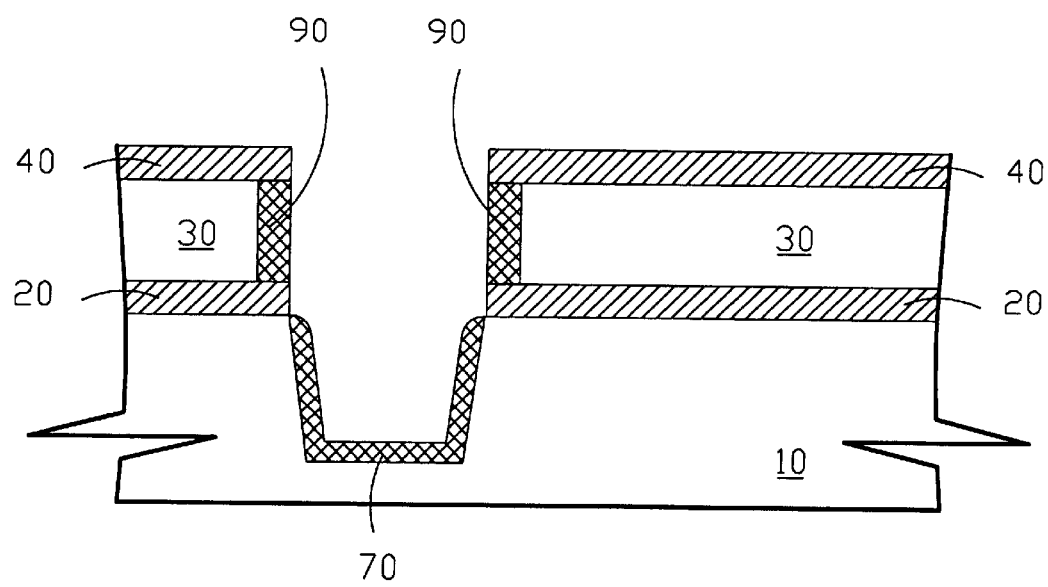

Next, a liner layer 70 is formed by the side-wall oxidation of the trench. A side-wall oxide layer 90 of the polysilicon layer 30 is simultaneously formed during the formation of the linear layer 70, shown in FIG. 1D. Since there is no silicon nitride film, the Kooi effect will not occur during the higher-temperature oxidation of the side-wall oxide layer 90.

Figure 1E:
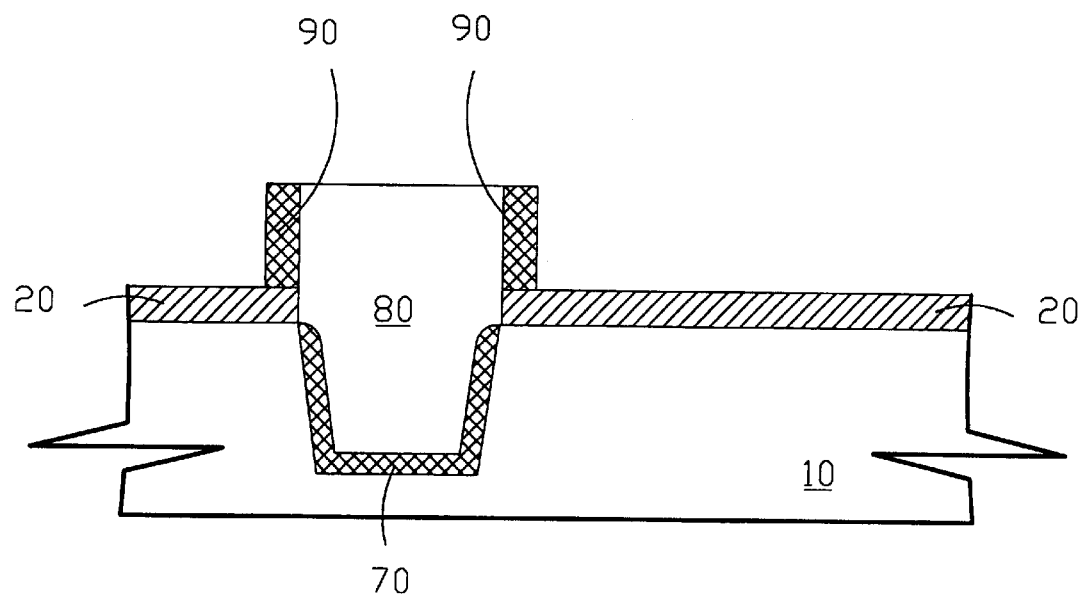

Then a trench structure 80 is formed by high-density plasma chemical vapor deposition of silicon oxide followed by chemical mechanical polishing. The oxide layer 40 and the polysilicon layer 30 are subsequently removed by any suitable method, shown in FIG. 1E.

Figure 1F:
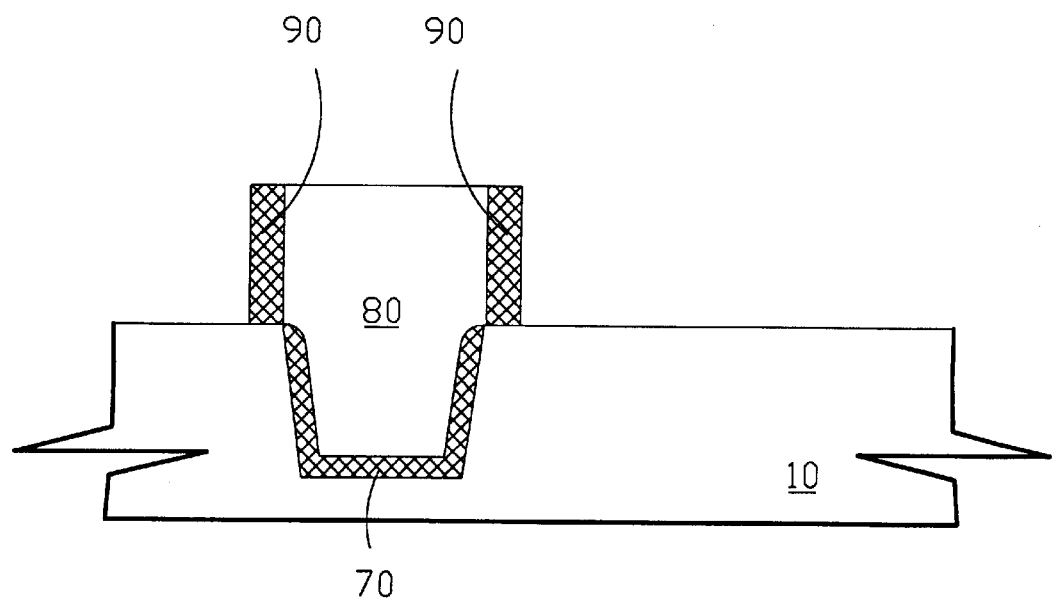

Next, the pad oxide layer 20 is then removed. As a key step of the present invention, during removal of the pad oxide layer 20, the side-wall oxide layer 90 can protect the trench structure 80 against corner recess, shown in FIG. 1F.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A formation method of a trench structure, said method comprising:

forming a pad oxide layer on a substrate;

forming a first polysilicon layer on said pad oxide layer;

forming an oxide layer on said first polysilicon layer;

forming a second polysilicon layer on said oxide layer;

forming a trench pattern into said second polysilicon layer, said oxide layer, said first polysilicon layer and said pad oxide layer to expose said substrate;

etching said exposed substrate to form a trench;

removing said second polysilicon layer;

performing a side-wall oxidation to oxidize said exposed first polysilicon layer and said exposed substrate;

filling said trench with silicon oxide; and removing all of said oxide layer and said first polysilicon layer to expose said pad oxide layer.

2. The method according to claim 1, wherein said trench pattern is formed by forming a photoresist layer on said second polysilicon layer, patterning said photoresist layer to define said trench pattern and expose said second polysilicon layer, and etching said second polysilicon layer, said oxide layer, said first polysilicon layer and said pad oxide layer to expose said substrate.

3. The method according to claim 1, wherein said trench is filled by a high-density plasma chemical vapor deposition process.

4. The method according to claim 1, a chemical mechanical polishing process is performed after said trench is filled.

5. The method according to claim 1 further comprises a step of removing said exposed pad oxide layer to expose said substrate.

6. A formation method of a trench structure, said method comprising:

forming a pad oxide layer on a substrate;

forming a first polysilicon layer on said pad oxide layer;

forming an oxide layer on said first polysilicon layer;

forming a second polysilicon layer on said oxide layer;

forming a trench pattern into said second polysilicon layer, said oxide layer, said first polysilicon layer and said pad oxide layer to expose said substrate;

etching said exposed substrate to form a trench;

removing said second polysilicon layer;

performing a side-wail oxidation to oxidize said exposed first polysilicon layer and said exposed substrate;

depositing a silicon oxide layer over said oxide layer and said trench;

planarizing said silicon oxide layer to expose said oxide layer; and removing said oxide layer and said first polysilicon layer to expose said pad oxide layer.

7. A formation method of a trench structure, said method comprising:

forming a pad oxide layer on a substrate;

forming a first polysilicon layer on said pad oxide layer;

forming an oxide layer on said first polysilicon layer;

forming a second polysilicon layer on said oxide layer;

forming a photoresist layer on said second polysilicon layer;

patterning said photoresist layer to define a trench pattern and expose said second polysilicon layer;

etching said second polysilicon layer, said oxide layer, said first polysilicon layer and said pad oxide layer to expose said substrate;

etching said substrate to form a trench;

removing said second polysilicon layer;

performing a side-wail oxidation to oxidize said exposed first polysilicon layer and said exposed substrate;

depositing a silicon oxide layer over said oxide layer and said trench;

planarizing said silicon oxide layer to expose said oxide layer; and removing said oxide layer and said first polysilicon layer to expose said pad oxide layer.

* * * * *